United States Patent [19]

Ide et al.

[11] Patent Number: 4,938,859

[45] Date of Patent: Jul. 3, 1990

[54] ION BOMBARDMENT DEVICE WITH HIGH FREQUENCY

[75] Inventors: Yoshio Ide, Mishima; Masahiro Mori; Ryo Yoshida, both of Gotenba; Masaaki Miyake, Oi; Tsukasa Sawaki, Gotenba; Kazuo Hara, Kawasaki, all of Japan

[73] Assignee: Vacuum Optics Corporation of Japan, Tokyo, Japan

[21] Appl. No.: 760,430

[22] Filed: Jul. 30, 1985

[30] Foreign Application Priority Data

Jul. 31, 1984 [JP] Japan .................... 59-159371
Apr. 10, 1985 [JP] Japan .................... 60-74306

[51] Int. Cl.$^5$ .......................................... C23C 14/00
[52] U.S. Cl. ............................. 118/723; 204/192.31; 204/298.05; 118/50.1; 118/723; 118/730
[58] Field of Search ............ 204/298, 192 R, 192 N; 118/50.1, 722, 723, 729, 730

[56] References Cited

U.S. PATENT DOCUMENTS

| | | | |
|---|---|---|---|
| 3,699,034 | 10/1972 | Lins et al. | 204/298 X |
| 3,730,873 | 5/1973 | Pompei et al. | 204/298 |
| 3,962,988 | 6/1976 | Murayama et al. | 204/192 N X |
| 4,038,171 | 7/1977 | Moss et al. | 204/298 |
| 4,039,416 | 8/1977 | White | 204/298 X |
| 4,096,026 | 6/1978 | Takeuchi | 204/192 D X |
| 4,342,631 | 8/1982 | White et al. | 204/298 X |
| 4,399,013 | 8/1983 | Sugita et al. | 204/192 N |
| 4,399,016 | 8/1983 | Tsukada et al. | 204/298 X |
| 4,466,872 | 8/1984 | Einbinder | 204/298 X |
| 4,496,448 | 1/1985 | Tai et al. | 204/298 X |
| 4,511,594 | 4/1985 | Yanai et al. | 204/192 N X |
| 4,533,450 | 8/1985 | Moustakas | 204/298 |

FOREIGN PATENT DOCUMENTS

| | | | |
|---|---|---|---|
| 1027825 | 3/1976 | Japan | 204/298 |
| 0049094 | 11/1983 | Japan . | |
| 0049095 | 11/1983 | Japan . | |

OTHER PUBLICATIONS

The Physics of Fluids, vol. 6, No. 9, Sep. 1963, pp. 1346-1354, Butler et al., "Plasma Sheath Formation by Radio-Frequency Fields".
Journal of Vacuum Science Technology, Jan.-Mar. 1983, pp. 60-68, Horwitz, "RF Sputtering-Voltage Division Between Two Electrodes".

Primary Examiner—Nam X. Nguyen
Attorney, Agent, or Firm—Armstrong, Nikaido, Marmelstein, Kubovcik & Murray

[57] ABSTRACT

In a high frequency ion plating device, when an evaporation substrate is intended to be rotated to form a uniform evaporated film, a variation in resistance of a contact in a rotating portion arises, making it almost impossible to provide a constant duration of high frequency discharge.

A supply of a high frequency power to the substrate is effected through an auxiliary electrode such as a coil, and a dc voltage is induced in the auxiliary electrode and applied to the substrate simultaneously with a high frequency voltage. As a result of the coil the high frequency discharge is stabilized, and a stabilized supply of power is rendered possible.

4 Claims, 2 Drawing Sheets

ION BOMBARDMENT DEVICE WITH HIGH FREQUENCY

BACKGROUND OF THE INVENTION

1. Field of the Invention

This invention relates to an ion bombardment generator in a vacuum vessel, and more particularly to an ion bombardment generator in which a high frequency voltage is applied to a substrate with a motion such as a rotation imparted thereto.

2. Description of the Prior Art

It has been widely used in an ion plating device, a plasma etching device and the like that an electrode is provided within a vacuum container, and this electrode is used as a substrate support base, to which is applied a high frequency power.

However, where the electrode is rotatable and a mechanical contact is used for the purpose of applying a high frequency power to the aforesaid rotatable electrode, the load impedance varies with any change in contact resistance during rotation of the contact, rendering a stabilized duration of high frequency discharge almost impossible.

SUMMARY OF THE INVENTION

According to this invention, where a motion such as a rotation needs to be imparted to a substrate itself to make ion bombardment onto the substrate uniform, a stabilized high frequency power can be applied to the substrate to provide an effective ion bombardment action.

In this invention, a high frequency power is applied to a metal substrate support base provided within a vacuum container with an inactive gas or an active gas or a mixture thereof introduced therein. Supply of the high frequency power to the substrate support base is effected through a coil-like auxiliary electrode arranged within the same vacuum container, and a metal base retainer is disposed on the substrate support base, whereby while a mechanical motion such as a rotation is being imparted to the substrate retainer, an atmospheric gas is ionized and a dc bias voltage is induced in the substrate to effect ion plating, plasma etching or the like by these ions.

The ion bombardment device having the aforesaid construction has a simple arrangement wherein power is supplied to the substrate support base through an auxiliary electrode provided within the same container. With this arrangement, a gas within the container is formed into a plasma by a coil portion of the auxiliary electrode, and at the same time, a dc voltage is generated between the auxiliary electrode and the substrate support base and the plasma whereby both the high frequency power and the dc bias voltage induced thereby can be applied to the substrate retainer in a stabilized fashion. Also, a uniform and effective ion bombardment can be provided by the ions ionized with high efficiency within the plasma.

DETAILED DESCRIPTION OF THE PREFERRED EMBODIMENTS

Figure 1:
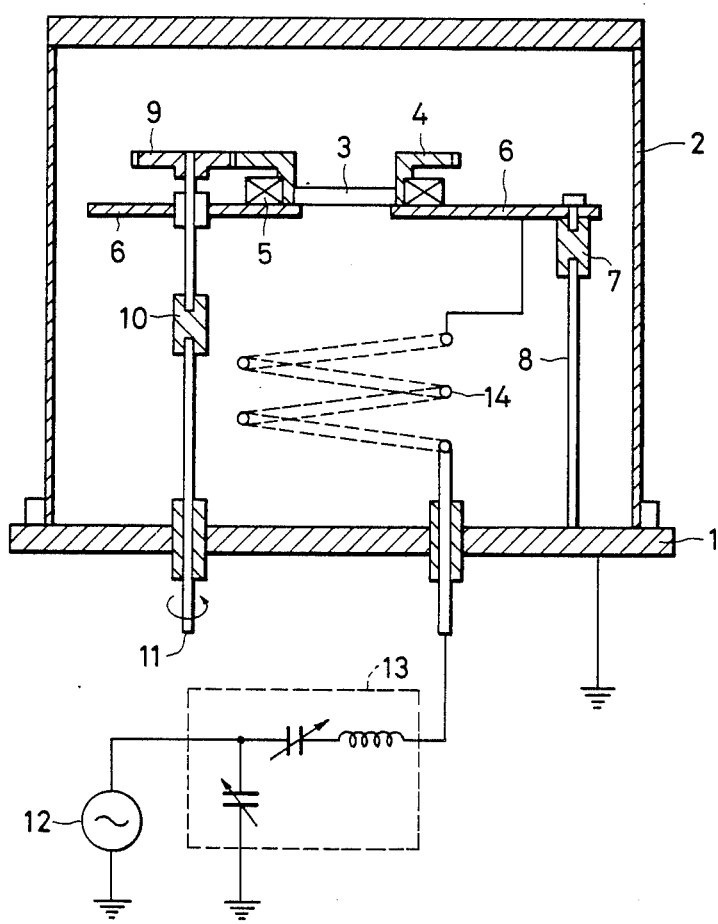
FIG. 1 is a structural view of a first embodiment of an ion generator according to the present invention.

FIG. 1 shows a first embodiment of the ion bombardment device in accordance with the present invention, which comprises a base plate 1 and a container wall 2, which surround a vacuum vessel into which is introduced suitable gases such as an inactive gas, an active gas or a mixture thereof wherein they are evacuated by a vacuum pump so that the vessel is maintained at a suitable pressure. Within the vacuum vessel, a substrate 3 is retained on a substrate retainer 4 and is disposed on a substrate support base 6 through bearing 5. This support base 6 is supported on a support rod 8 through an insulating member 7 and secured to the base plate 1. The substrate retainer 4 is rotatably disposed on the support base 6 and is applied with a rotary motion from outside by a driving shaft 11 through a gear 9 meshed with teeth formed on the outer edge thereof and an insulating member 10. A high frequency power released from a high frequency power source 12 is introduced into the vacuum vessel via a matching unit 13 and supplied to the substrate support base 6 via a coil-like auxiliary electrode 14.

Where the auxiliary electrode 14 is not provided, due to a variation in load impedance resulting from a variation of contact resistance of a mechanical contact portion in the bearing 5 as the substrate retainer 4 rotates, a stabilized duration of high frequency discharge is difficult to obtain and more difficult when the number of the substrate retainers 4 increases. On the other hand, when the coil-like auxiliary electrode 14 is provided within the vacuum vessel to supply a high frequency power through the aforesaid electrode, as shown in this embodiment, the introduced gas is formed into a plasma by the action of the coil-like portion. Ionization thereof is thereby effectively effected, the stabilized discharge is continuously made, a dc voltage is generated between the auxiliary electrode 14 and the substrate support base 6 and the plasma, and this voltage creates a bias voltage applied to the substrate retainer 4 through the bearing 5.

Charged particles accelerated by the thus obtained high frequency discharge and bias voltage bombard against the surface of the substrate 3 to make it possible to purify the surface of the substrate and to form an evaporated film of higher density.

Figure 2:
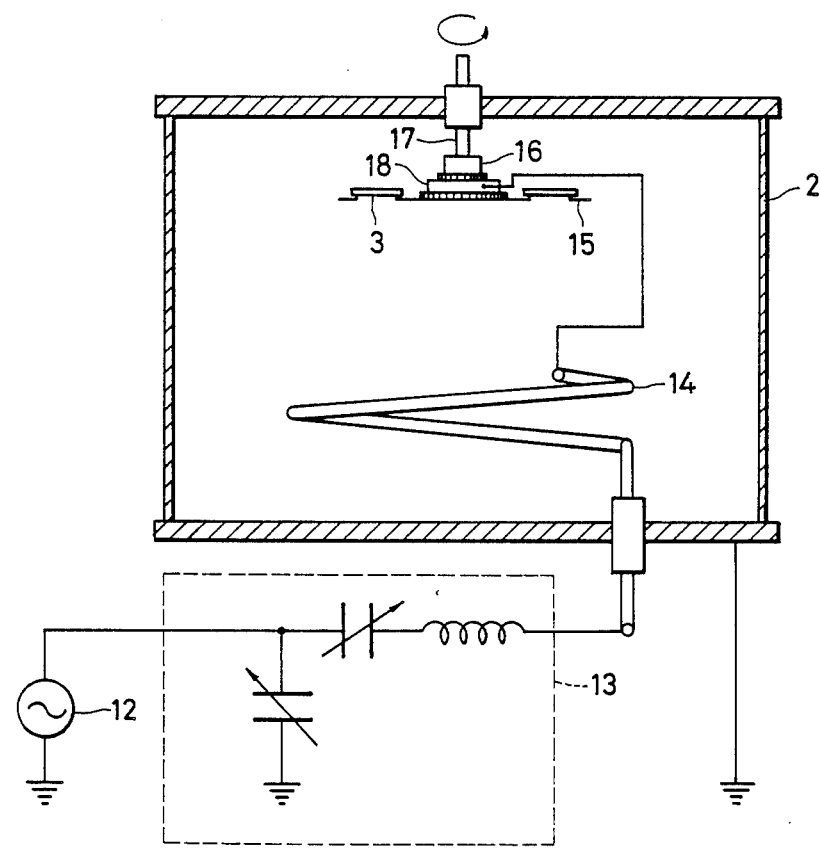
FIG. 2 is a structural view showing a further embodiment of the same.

FIG. 2 shows a further embodiment in which a plurality of substrates are arranged on a substrate support base for simultaneous evaporation thereof, in which a rotation is provided on the substrate support base so as to form uniform evaporated films on the plurality of substrates. Within a vacuum vessel 2 into which is introduced an inert gas, an active gas or a mixture thereof, a substrate retaining electrode 15 is secured to a rotary shaft 17 through an insulating member 16 to provide a rotating electrode, and a substrate 3 is arranged on the substrate retaining electrode. High frequency power released from a high frequency power source 12 is subjected to matching by a matching network 13, and supplied to the substrate retaining electrode 15 passing through a contactor 18 via an auxiliary electrode 14.

In a conventional device not provided with the auxiliary electrode 14, duration of a high frequency discharge has been difficult to maintain due to a variation in load impedance resulting from a variation in contact resistance of the mechanical contact 18, as previously mentioned. In this embodiment, however, the provision of the coil-like auxiliary electrode 14 leads to the effective ionization of the introduced gas, and furthermore the dc bias voltage generated in the auxiliary electrode 14 is supplied to the substrate retaining electrode.

Charged particles accelerated by the high frequency discharge and the bias voltage bombard the surface of the substrate 3 to make it possible to purify the surface of the substrate and form an evaporated film of higher density.

While in the aforementioned embodiment, the substrate retaining electrode is merely rotated, it will be obvious that a plurality of substrate retainers can be rotated and revolved on the substrate support base by designing a gear mechanism.

Furthermore, while in the illustrated embodiment, the auxiliary electrode is in the form of a coil, it will be noted needless to say that a condenser-like configuration or other suitable configurations can be also used.

What is claimed is:

1. An ion bombardment device comprising:
   a vacuum vessel;
   a gaseous ion source medium introduced into said vessel;
   a rotatable electrode within said vacuum vessel for supporting a substrate;
   a single electrical potential source connected to said vessel consisting of means for ionizing said gaseous ion source medium, including means for supplying high frequency power to an auxiliary electrode in said vessel;
   mechanical contact means within said vessel connected to said high frequency power supplying means through said auxiliary electrode for connecting high frequency power to said rotatable electrode, said mechanical contact means being subject to variations in contact resistance upon rotation of said rotatable electrode; and
   means for stabilizing a high frequency discharge created by said high frequency power within said vessel against disruption due to said variations in contact resistance comprising said auxiliary electrode being a coil-like electrode connected within said vessel between said high frequency supplying means and said mechanical contact.

2. The ion bombardment device according to claim 1 wherein a plurality of substrate support bases are arranged on a rotating substrate support base.

3. An ion bombardment device according to claim 1 wherein said mechanical contact means includes a fixed substrate support base to which supply of high frequency power is effected through said coil-like auxiliary electrode within said vacuum vessel and a metal substrate support serving as said rotatable electrode rotatably disposed on said fixed substrate support base, and a mechanical motion such as a rotation is provided for said substrate support at substantially the same DC potential as that of the substrate support base.

4. An ion bombardment device comprising:
   a vacuum vessel;
   a gaseous ion source medium introduced into said vessels;
   a rotatable electrode within said vacuum vessel for supporting a substrate, said rotatable electrode being electrically insulated from said vessel;
   a coil-like auxiliary electrode within said vessel electrically connected at a first end within said vessel to said rotatable electrode by a mechanical contact subject to variations in contact resistance, a second end of said auxiliary electrode being insulated from said vessel and extending out of said vessel; and
   a single electrical potential source connected to said vessel consisting of means connected to said second end of said auxiliary electrode for supplying high frequency power to said rotatable electrode to create a discharge within said chamber to ionize said gaseous ion source medium, said coil-like auxialiary electrode within said vessel serving to stabilize said high frequency discharge against disruption due to said variations in contact resistance of said mechanical contact.

* * * * *